US012072601B2

(12) United States Patent
Li et al.

(10) Patent No.: US 12,072,601 B2
(45) Date of Patent: *Aug. 27, 2024

(54) ELECTRICALLY-TUNABLE OPTICAL FILTER

(71) Applicant: Apple Inc., Cupertino, CA (US)

(72) Inventors: Jiayu Li, Cupertino, CA (US); Dawei Lu, Campbell, CA (US)

(73) Assignee: Apple Inc., Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/127,889

(22) Filed: Mar. 29, 2023

(65) Prior Publication Data

US 2023/0236469 A1 Jul. 27, 2023

Related U.S. Application Data

(63) Continuation of application No. 17/330,274, filed on May 25, 2021, now Pat. No. 11,619,857.

(51) Int. Cl.
*G02F 1/23* (2006.01)
*G01J 1/04* (2006.01)
(Continued)

(52) U.S. Cl.
CPC .............. *G02F 1/23* (2013.01); *G01J 1/0488* (2013.01); *G01J 1/4204* (2013.01);
(Continued)

(58) Field of Classification Search
CPC .... G02F 1/23; G02F 1/0121; G02F 2203/055; G01J 1/4204; H01L 31/02327; H01L 33/58

See application file for complete search history.

(56) References Cited

U.S. PATENT DOCUMENTS 6,476,783 B2 11/2002 Matthies et al.
7,349,574 B1 3/2008 Sodini et al.
(Continued)

FOREIGN PATENT DOCUMENTS

CN 105229788 1/2016
CN 106104565 11/2016
(Continued)

OTHER PUBLICATIONS

Charlet et al., "Chip-to-chip interconnections based on the wireless capacitive coupling for 3D integration," *Microelectronic Engineering*, vol. 83, 2006, pp. 2195-2199.
(Continued)

*Primary Examiner* — Georgia Y Epps
*Assistant Examiner* — Don J Williams
(74) *Attorney, Agent, or Firm* — Brownstein Hyatt Farber & Schreck, LLP

(57) ABSTRACT

An optical device stack includes at least one of a photodetector or an optical emitter and a metasurface. The metasurface is disposed over a light-receiving surface of the photodetector or a light emission surface of the optical emitter. The metasurface includes a first conductive layer having an electrically-tunable optical property and an array of conductive nanostructures disposed on a first side of the first conductive layer. A second conductive layer is disposed on a second side of the first conductive layer. An electrical insulator is disposed between the first conductive layer and the second conductive layer. A change in an electrical bias between the metasurface and the second conductive layer, from a first electrical bias to a second electrical bias, tunes the electrically-tunable optical property from a first state to a second state, and changes an electrically-tunable optical filtering property of the metasurface.

20 Claims, 12 Drawing Sheets

(51) Int. Cl.
*G01J 1/42* (2006.01)
*G02F 1/01* (2006.01)
*H01L 31/0232* (2014.01)
*H01L 33/58* (2010.01)

(52) U.S. Cl.
CPC ...... *G02F 1/0121* (2013.01); *H01L 31/02327* (2013.01); *H01L 33/58* (2013.01); *G02F 2203/055* (2013.01)

(56) References Cited

U.S. PATENT DOCUMENTS

| | | |
|---|---|---|
| 8,111,306 B2 | 2/2012 | Kuruma et al. |
| 8,128,890 B2 | 5/2012 | Droog |
| 8,792,020 B2 | 7/2014 | Lee et al. |
| 8,957,358 B2 | 2/2015 | Wan et al. |
| 8,963,886 B2 | 2/2015 | Wassvik |
| 8,975,752 B2 | 3/2015 | Chow et al. |
| 9,312,294 B2 | 4/2016 | Chuang et al. |
| 9,349,035 B1 | 5/2016 | Gerber |
| 9,362,320 B2 | 6/2016 | Yamashita et al. |
| 9,372,283 B2 | 6/2016 | Nikoobakht |
| 9,437,132 B2 | 9/2016 | Rappoport et al. |
| 9,445,026 B2 | 9/2016 | Kobayashi et al. |
| 9,594,476 B2 | 3/2017 | Yang et al. |
| 9,720,535 B2 | 8/2017 | Yang et al. |
| 9,860,467 B2 | 1/2018 | Kim et al. |
| 10,026,771 B1 | 7/2018 | Lee et al. |
| 10,042,467 B2 | 8/2018 | Schwartz et al. |
| 10,146,258 B2 | 12/2018 | Sinha et al. |
| 10,181,070 B2 | 1/2019 | Smith et al. |
| 10,205,898 B2 | 2/2019 | McMahon et al. |
| 10,360,431 B2 | 7/2019 | Gozzini et al. |
| 10,394,014 B2 | 8/2019 | Sakai |
| 10,481,420 B2 * | 11/2019 | Bonod .................... G02B 5/20 |
| 10,635,878 B2 | 4/2020 | Yi et al. |
| 10,658,404 B2 | 5/2020 | Abe et al. |
| 10,685,202 B2 | 6/2020 | Kim et al. |
| 10,713,458 B2 | 7/2020 | Bhat et al. |
| 10,733,408 B2 | 8/2020 | Bok |
| 10,733,931 B2 | 8/2020 | Jung et al. |
| 10,739,807 B2 | 8/2020 | Lallement et al. |
| 10,838,126 B2 | 11/2020 | Wang et al. |
| 10,868,064 B2 | 12/2020 | Wada et al. |
| 11,073,712 B2 | 7/2021 | Yeke Yazdandoost et al. |
| 11,121,165 B2 | 9/2021 | Lee et al. |
| 11,177,311 B2 | 11/2021 | Juen et al. |
| 11,619,857 B2 * | 4/2023 | Li ........................ H01L 31/0236 250/226 |
| 2005/0002448 A1 | 1/2005 | Knight et al. |
| 2005/0174335 A1 | 8/2005 | Kent et al. |
| 2008/0054320 A1 | 3/2008 | Solhusvik et al. |
| 2010/0045364 A1 | 2/2010 | Law et al. |
| 2011/0115041 A1 | 5/2011 | Dan et al. |
| 2012/0262408 A1 | 10/2012 | Pasquero et al. |
| 2014/0133715 A1 | 5/2014 | Ballard et al. |
| 2015/0177884 A1 | 6/2015 | Han |
| 2015/0177979 A1 | 6/2015 | Johansson et al. |
| 2016/0163753 A1 | 6/2016 | Yu et al. |
| 2018/0074627 A1 | 3/2018 | Kong et al. |
| 2018/0358393 A1 | 12/2018 | Sato et al. |
| 2021/0240026 A1 | 8/2021 | Yeke Yazdandoost et al. |
| 2021/0311240 A1 | 10/2021 | Siddique et al. |
| 2022/0115428 A1 | 4/2022 | Borremans |
| 2022/0272291 A1 | 8/2022 | Mas et al. |
| 2022/0382120 A1 | 12/2022 | Li et al. |

FOREIGN PATENT DOCUMENTS

| | | |
|---|---|---|
| CN | 106298856 | 1/2017 |
| CN | 107004130 | 8/2017 |
| CN | 107870689 | 4/2018 |
| JP | 2009042870 | 2/2009 |
| KR | 1020170113066 | 10/2017 |
| WO | WO 20/052607 | 5/2010 |
| WO | WO 15/005959 | 1/2015 |
| WO | WO 18/040512 | 3/2018 |

OTHER PUBLICATIONS

Neubrech et al Science Advances 2020, vol. 6: eabc2709, Sep. 4, 2020, 21 pages.
U.S. Appl. No. 17/891,963, filed Aug. 19, 2022, Yan et al.
U.S. Appl. No. 17/950,325, filed Sep. 22, 2022, Lee et al.

* cited by examiner

ELECTRICALLY-TUNABLE OPTICAL FILTER

CROSS-REFERENCE TO RELATED APPLICATION

This application is a continuation of U.S. patent application Ser. No. 17/330,274, filed May 25, 2021, the contents of which are incorporated hereby by reference as if fully disclosed herein.

FIELD

The described embodiments relate generally to optical filters, such as color filters. More particularly, the described embodiments relate to optical filters for optical sensors (e.g., ambient light sensors or proximity sensors) or optical emitters (e.g., flood or spot illuminators).

BACKGROUND

When sensing electromagnetic radiation, it may be necessary or useful to sense the intensity of different electromagnetic radiation wavelengths, or different ranges of electromagnetic radiation wavelengths. Typically, different electromagnetic radiation wavelengths or ranges are sensed by different optical sensors, with the electromagnetic radiation received by different optical sensors being filtered by different optical filters (e.g., different color filters) positioned in the optical reception paths of different optical sensors.

It may also be necessary or useful to emit different electromagnetic radiation wavelengths, or different ranges of electromagnetic radiation wavelengths, at different times. Typically, the different electromagnetic radiation wavelengths or ranges are emitted by different optical emitters, with different optical emitters being filtered by different optical filters (e.g., different color filters) positioned in the optical emission paths of the different optical emitters.

SUMMARY

Embodiments of the systems, devices, methods, and apparatus described in the present disclosure are directed to optical sensors including electrically-tunable optical filters in their optical reception paths, and optical emitters including electrically-tunable optical filters in their optical emission paths.

In a first aspect, the present disclosure describes an optical device stack. The optical stack may include at least one of a photodetector or an optical emitter. A metasurface may be disposed over at least one of a light-receiving surface of the photodetector or a light emission surface of the optical emitter. The metasurface may include a first conductive layer having an electrically-tunable optical property and an array of conductive nanostructures disposed on a first side of the first conductive layer. The optical stack may further include a second conductive layer on a second side of the first conductive layer and an electrical insulator disposed between the first conductive layer and the second conductive layer. A change in an electrical bias between the metasurface and the second conductive layer, from a first electrical bias to a second electrical bias, may tune the electrically-tunable optical property from a first state to a second state and change an electrically-tunable optical filtering property of the metasurface.

In another aspect, the present disclosure describes an optoelectronic device. The optoelectronic device may include a pixel, which in turn includes a metasurface. The metasurface may include an array of gold nanowires disposed on a layer of indium tin oxide (ITO). The pixel may also include a layer of gold and a layer of alumina disposed between the metasurface and the layer of gold. A voltage source may be electrically connected to the metasurface and the layer of gold. A controller may be configured to change a voltage between the metasurface and the layer of gold by programming the voltage source.

In still another aspect of the disclosure, the present disclosure describes a method of characterizing ambient light. The method may include receiving a first set of wavelengths of the ambient light through a metasurface while the metasurface is in a first state. The metasurface may include an array of nanowires formed on a layer of material having an electrically-tunable optical property. The method may also include measuring a first intensity of the first set of wavelengths; applying a voltage to the metasurface to bias the metasurface to a second state different from the first state; receiving a second set of wavelengths of the ambient light through the metasurface while the metasurface is in the second state; measuring a second intensity of the second set of wavelengths; and characterizing the ambient light using at least the first intensity and the second intensity.

In addition to the exemplary aspects and embodiments described above, further aspects and embodiments will become apparent by reference to the drawings and by study of the following description.

BRIEF DESCRIPTION OF THE DRAWINGS

The disclosure will be readily understood by the following detailed description in conjunction with the accompanying drawings, wherein like reference numerals designate like structural elements, and in which.

Figure 1:
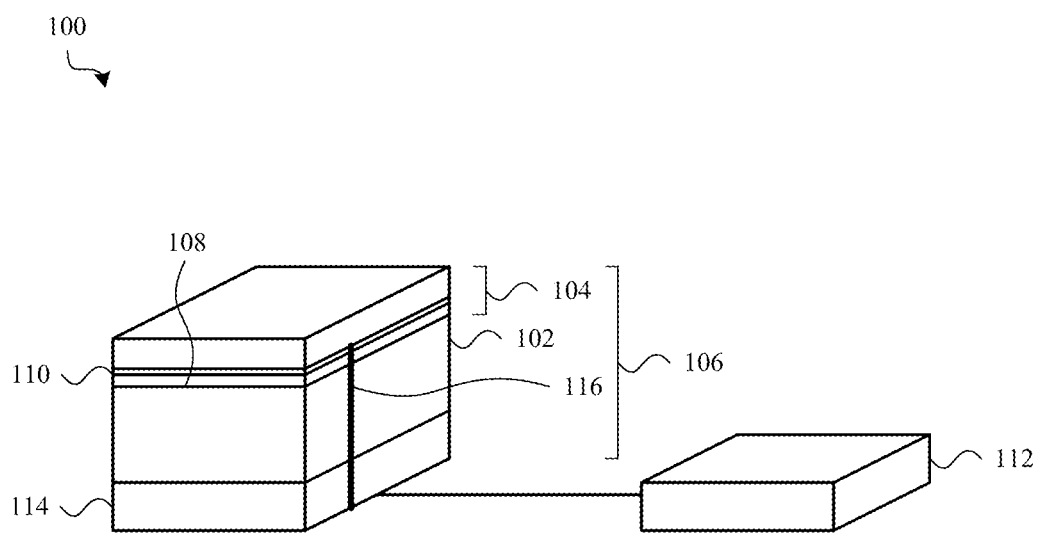
FIG. 1 shows an isometric view of a first example optoelectronic device.

The use of cross-hatching or shading in the accompanying figures is generally provided to clarify the boundaries between adjacent elements and also to facilitate legibility of the figures. Accordingly, neither the presence nor the absence of cross-hatching or shading conveys or indicates any preference or requirement for particular materials, material properties, element proportions, element dimensions, commonalities of similarly illustrated elements, or any other characteristic, attribute, or property for any element illustrated in the accompanying figures.

Additionally, it should be understood that the proportions and dimensions (either relative or absolute) of the various features and elements (and collections and groupings thereof) and the boundaries, separations, and positional relationships presented therebetween, are provided in the accompanying figures merely to facilitate an understanding of the various embodiments described herein and, accordingly, may not necessarily be presented or illustrated to scale, and are not intended to indicate any preference or requirement for an illustrated embodiment to the exclusion of embodiments described with reference thereto.

DETAILED DESCRIPTION

Reference will now be made in detail to representative embodiments illustrated in the accompanying drawings. It should be understood that the following description is not intended to limit the embodiments to one preferred embodiment. To the contrary, it is intended to cover alternatives, modifications, and equivalents as can be included within the spirit and scope of the described embodiments as defined by the appended claims.

One type of optical sensor that may be improved when it is configured to sense different electromagnetic radiation wavelengths is the ambient light sensor (ALS). However, the area within a device that is allocated for implementing an ALS may be relatively small, and it may be beneficial to reduce the area allocated for implementing an ALS even further and/or provide more ALS functionality within the allotted area. When an electrically-tunable optical filter is positioned in the optical reception path of an ALS pixel, a single ALS pixel may be used to sense different electromagnetic radiation wavelengths (or different ranges of electromagnetic radiation wavelengths) at different times (e.g., the sensing of different electromagnetic radiation wavelengths may be time-modulated). The different electromagnetic radiation wavelengths (or ranges of wavelengths) may include different visible and/or non-visible electromagnetic radiation wavelengths. An ALS that includes a couple or a few pixels, one or more of which receive electromagnetic radiation through a respective electrically-tunable optical filter, may sense even more different electromagnetic radiation wavelengths (or more different ranges of electromagnetic radiation wavelengths) or may sense different electromagnetic radiation wavelengths (or ranges of wavelengths) quicker.

In some cases, the intensities of the different electromagnetic radiation wavelengths sensed by an ALS may be used to adjust the brightness or color (e.g., white point) of a display, so that the display may be viewed more easily in a particular ambient light. The intensities of the different electromagnetic radiation wavelengths sensed by an ALS may also be used to conserve power, such as by operating a display at no more than a needed brightness for a particular ambient light condition.

These and other aspects are described with reference to FIGS. 1-8. However, those skilled in the art will readily appreciate that the detailed description given herein with respect to these figures is for explanatory purposes only and should not be construed as limiting.

Directional terminology, such as "top", "bottom", "upper", "lower", "front", "back", "over", "under", "above", "below", "left", "right", etc. is used with reference to the orientation of some of the components in some of the figures described below. Because components in various embodiments can be positioned in a number of different orientations, directional terminology is used for purposes of defining relative positions of various structures, and may not always define absolute positions. For example, a first structure described as being "above" a second structure and "below" a third structure is also "between" the second and third structures, and would be "above" the third structure and "below" the second structure if the stack of structures were to be flipped. Also, as used herein, the phrase "at least one of" preceding a series of items, with the term "and" or "or" to separate any of the items, modifies the list as a whole, rather than each member of the list. The phrase "at least one of" does not require selection of at least one of each item listed; rather, the phrase allows a meaning that includes one or more of any of the items, or one or more of any combination of the items, or one or more of each of the items. By way of example, the phrases "at least one of A, B, and C" or "at least one of A, B, or C" each refer to one or more of only A, only B, or only C; any combination of A, B, or C; and one or more of each of A, B, and C. Similarly, it may be appreciated that an order of elements presented for a conjunctive or disjunctive list provided herein should not be construed as limiting the disclosure to only that order provided.

As used herein, a "layer" refers to one or more materials that are typically, but not necessarily, parallel to the top surface and/or bottom surface of a substrate or another layer.

FIG. 1 shows an isometric view of a first example optoelectronic device 100. By way of example, the device 100 may be configured as an optical sensor, an optical emitter, or an optical transceiver including both an optical sensor and an optical emitter. As an optical sensor, the device 100 may be used as an ambient light sensor, a proximity sensor, and so on. As an optical emitter, the device 100 may be used as a flood or spot illuminator for example. As an optical transceiver, the device 100 may perform the functions of both a photodetector and an optical emitter.

When the device 100 is configured as an optical sensor, the device 100 may include a photodetector 102 (e.g., a photodiode or phototransistor) and a metasurface 104 defining part or all of an optical stack 106 (e.g., an optical sensor stack). The metasurface 104 may be disposed over a light-receiving surface 108 of the photodetector 102 and include a layer 110 having an electrically-tunable optical property (e.g., a tunable refractive index). A controller 112 may be configured to apply an electrical bias to the metasurface 104. For example, the controller 112 may be configured to program a voltage source 114 coupled to the metasurface 104, which voltage source 114 is configured to apply a voltage to the metasurface 104 (e.g., via interconnect 116 including one or more conductive vias, conductive traces, wires, and so on). In some cases, the controller 112 may be configured to program the voltage source 114 in different ways, to apply different voltages to the metasurface 104. In some cases, the controller 112 may program the voltage source 114 to provide a neutral voltage to the metasurface 104, or may cause the metasurface 104 to be grounded, or may turn the voltage source 114 off, thereby allowing the metasurface 104 to assume an unbiased state.

When a first electrical bias (e.g., a first voltage) is applied to the metasurface 104, the electrically-tunable optical property of the layer 110 may be tuned to a first state, consequently changing an electrically-tunable optical filtering property of the metasurface 104 to a first state. When a second electrical bias (e.g., a second voltage) is applied to the metasurface 104, the electrically-tunable optical property of the metasurface 104 may be tuned to a second state, different from the first state, changing the electrically-tunable optical filtering property of the metasurface 104 to a second state, and so on. In some cases, the controller 112 may be configured to apply any number of one or more different electrical biases to the metasurface 104, with different electrical biases tuning the electrically-tunable optical property of the layer 110 to different states, and also tuning the electrically-tunable optical filtering property of the metasurface 104 to different states.

In some embodiments, the electrically-tunable optical filtering property of the metasurface 104 may be an optical passband peak. Thus, when the electrically-tunable optical filtering property is in the first state, the metasurface 104 may have a first optical passband peak and, when the electrically-tunable optical filtering property is in the second state, the metasurface 104 may have a second optical passband peak, different from the first optical passband peak. In some cases, the first and second states may have first and second optical passband peaks at different visible electromagnetic radiation wavelengths (e.g., green, yellow, red, blue, and so on). In other cases, the first state of the electrically-tunable optical filtering property may be associated with a first optical passband peak at a visible electromagnetic radiation wavelength, and the second state of the electrically-tunable optical filtering property may be associated with a second optical passband peak at a near-infrared electromagnetic radiation wavelength. The first and second states may alternatively have respective optical passband peaks at different non-visible electromagnetic radiation wavelengths (e.g., infrared (IR), near-IR, or ultraviolet (UV) wavelengths) or, more generally, at any two different electromagnetic radiation wavelengths. In this manner, the metasurface 104 may function as an electrically-tunable optical filter (i.e., an electrically-tunable electromagnetic radiation filter), such as a tunable color filter. Alternatively, the electrically-tunable optical filtering property may be an optical passband width (or range of electromagnetic radiation wavelengths) or another property.

By tuning the electrically-tunable optical property of the layer 110, different wavelengths of electromagnetic radiation may be allowed to pass through the metasurface 104 to the photodetector 102, such that the passed electromagnetic radiation wavelengths may be detected and/or measured.

When the device 100 is configured as an optical emitter, the device 100 may include a light-emitting element 102 (e.g., a light-emitting diode (LED)) and a metasurface 104 defining part or all of an optical stack 106 (e.g., an optical emitter stack). The light-emitting element 102 may emit a range of electromagnetic radiation wavelengths, and in some cases may include a set of sub-pixels, with each sub-pixel emitting the same or different ranges of electromagnetic radiation wavelengths. The metasurface 104 may be disposed over an emission surface 108 of the light-emitting element 102 and include a layer 110 having an electrically-tunable optical property (e.g., a tunable refractive index). A controller 112 may be configured to apply an electrical bias to the metasurface 104. For example, the controller 112 may be configured to program a voltage source 114 coupled to the metasurface 104, which voltage source 114 applies a voltage to the metasurface 104. The metasurface 104, controller 112, and voltage source 114 may all be configured and operated similarly to how they are configured and operated when the device 100 is configured as an optical sensor, to allow different wavelengths of electromagnetic radiation emitted by the light-emitting element 102 to pass through the metasurface 104.

When the device 100 is configured as an optical transceiver, the device 100 may both sense and emit through the metasurface 104.

Figure 2:
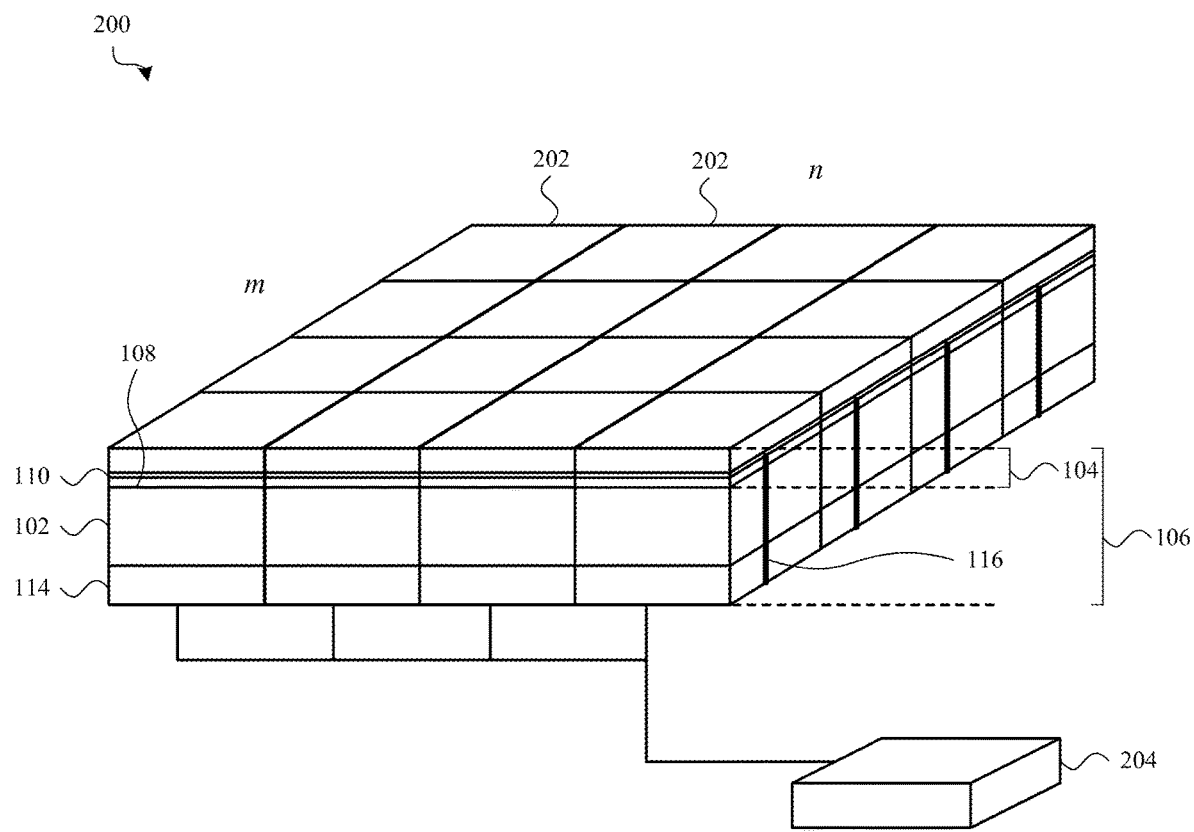
FIG. 2 shows an isometric view of a second example optoelectronic device.

FIG. 2 shows an isometric view of a second example optoelectronic device 200. The device 200 includes an array of pixels 202. By way of example, the pixels 202 in the array of pixels 202 are shown to be arranged in m columns and n rows (i.e., in an m×n array of pixels 202, where m and n are the same or different integers). However, the pixels 202 may alternatively be arranged in a single column or row, in concentric circles, or in other ways.

The device 200 may be configured as an optical sensor or an optical emitter, or may include a subset of optical sensor pixels co-located with, or interspersed with, a subset of optical emitter pixels. Each optical sensor pixel in the array of pixels 202 (or one or multiple optical sensor pixels) may be configured similarly to the optoelectronic device described with reference to FIG. 1 when the device is configured as an optical sensor. Each optical emitter pixel in the array of pixels 202 (or one or multiple optical emitter pixels) may be configured similarly to the optoelectronic device described with reference to FIG. 1 when the device is configured as an optical emitter. The device 200 as a whole, or those pixels 202 that are configured to operate as an optical sensor, may be used as an ambient light sensor, a proximity sensor, a light emitting element white point or health sensor, and so on. The device 200 as a whole, or those pixels 202 that are configured to operate as an optical emitter, may be used as a flood or spot illuminator, a display, and so on.

In some cases, a respective voltage source 114 may be electrically coupled to the metasurface 104 of each pixel 202 (e.g., in a one-to-one relationship), such that each voltage source 114 may apply a voltage to a respective metasurface 104 of a respective pixel 202. In other embodiments, a single voltage source (e.g., a voltage source having multiple taps) may be coupled to a subset or all of the pixels 202. In either case, a controller 204 may be configured to program the respective voltage sources 114 (or program a singular or fewer number of voltage sources having multiple taps or outputs).

The controller 204 may program the voltage source(s) 114 that are electrically coupled to first and second pixels 202 such that a same voltage is applied to the first and second pixels 202 at a same time or different times, or such that a first voltage is applied to the first pixel 202 and a second voltage, different from the first voltage, is applied to the second pixel 202 (at a same time or different times).

Figure 3A:
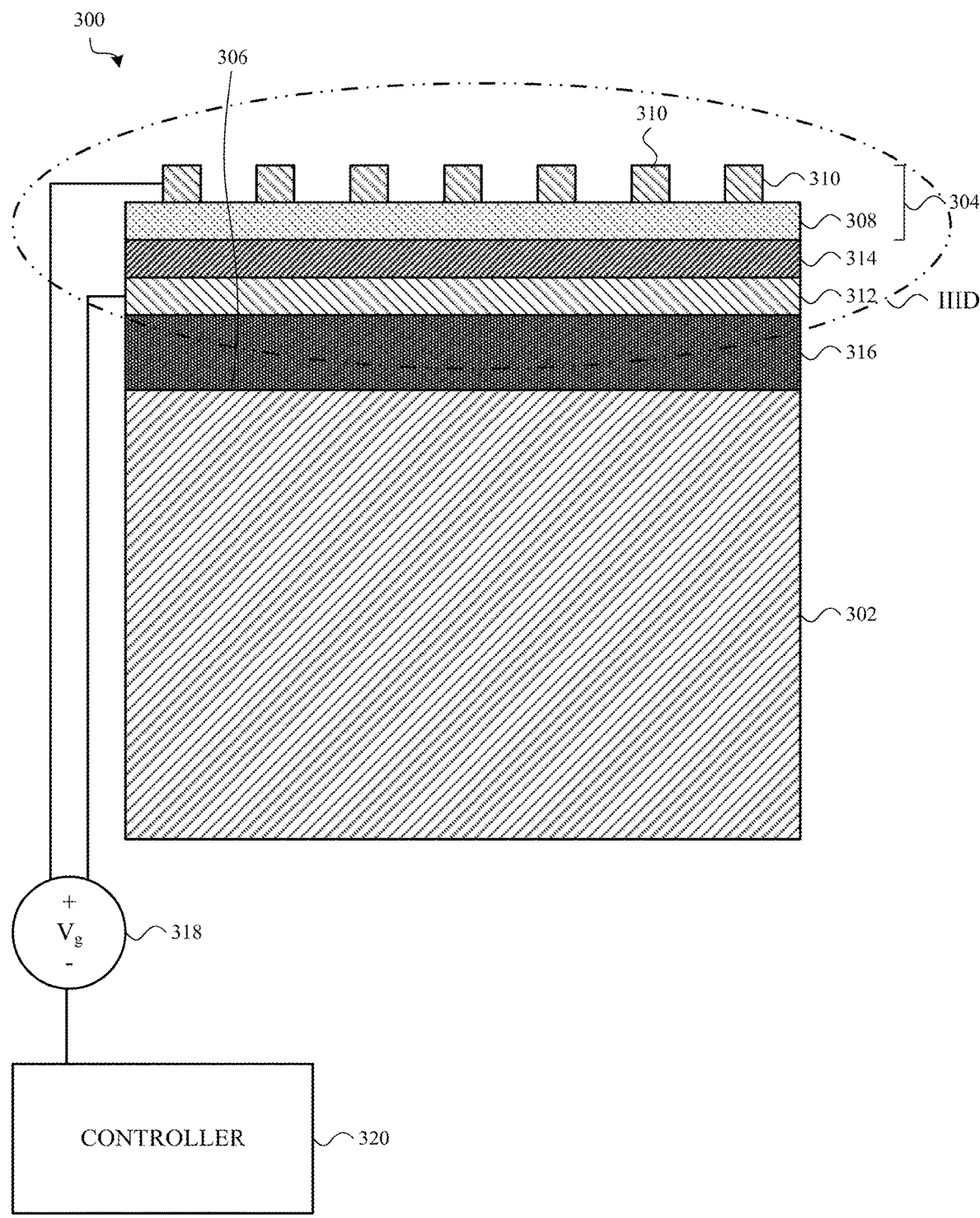
FIG. 3A shows an elevation of an example pixel of an optoelectronic device.
Figure 3B:
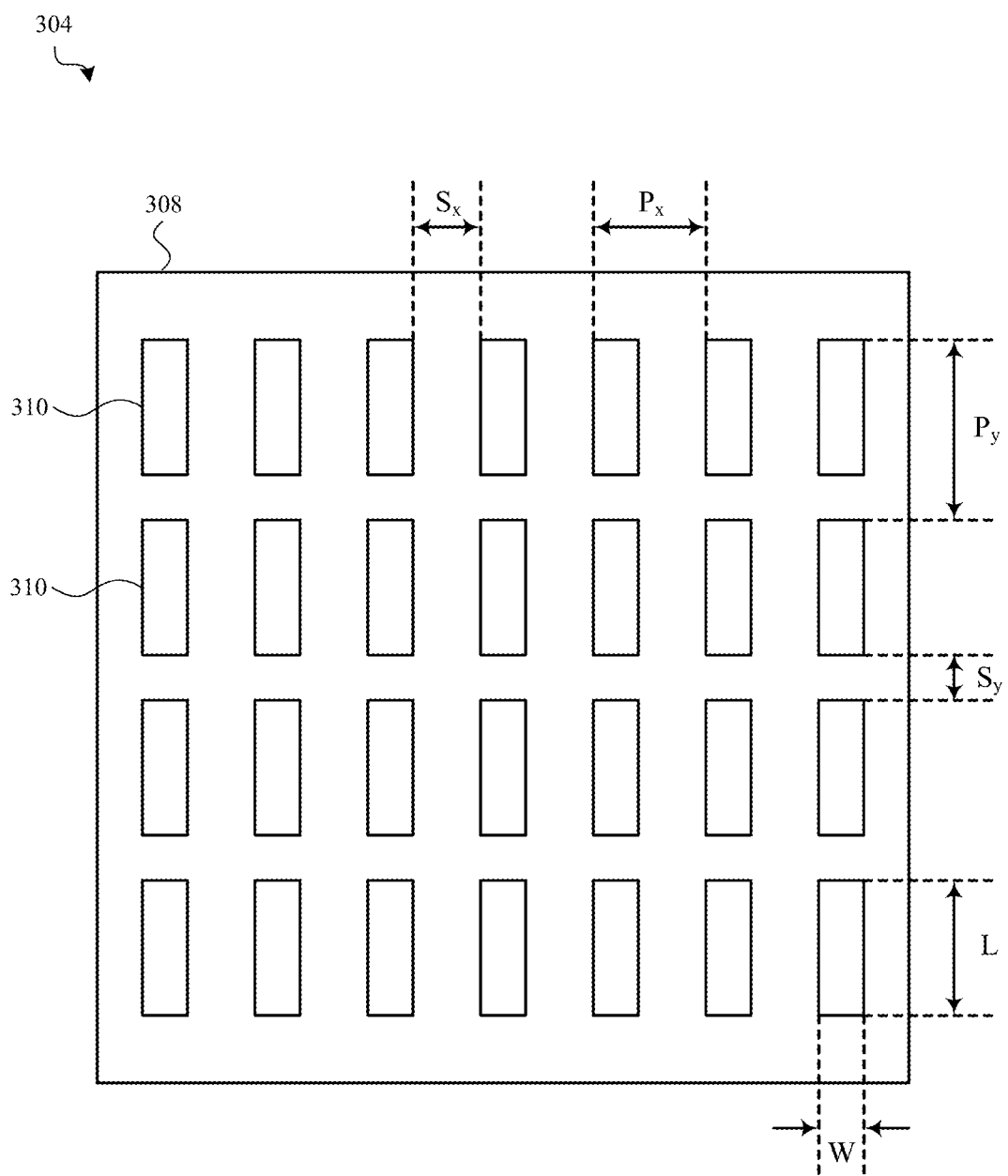
FIG. 3B shows a plan view of an example array of conductive nanostructures included in the pixel described with reference to FIG. 3A.
Figure 3C:
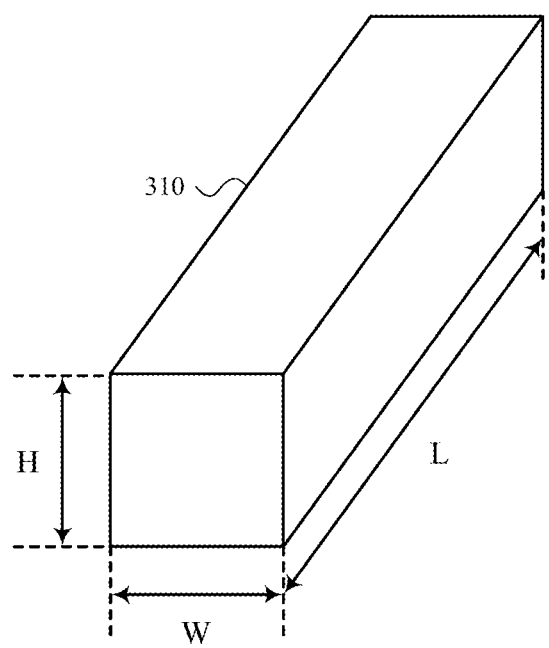
FIG. 3C shows an isometric view of an example conductive nanostructure included in the array of conductive nanostructures described with reference to FIG. 3A or 3B.

FIGS. 3A-3C show an example pixel 300 of an optoelectronic device. FIG. 3A shows an elevation of the pixel 300; FIG. 3B shows a plan view of an example array of conductive nanostructures included in the pixel 300; and FIG. 3C shows an isometric view of an example conductive nanostructure included in the array of conductive nanostructures. In some embodiments, the pixel 300 may be the optoelectronic device described with reference to FIG. 1. In some embodiments, the pixel 300 may be a pixel of the optoelectronic device described with reference to FIG. 2 (and in some cases, each optical sensor pixel (or multiple optical sensor pixels) in the optoelectronic device described with reference to FIG. 2 may be configured the same as, or similarly to, the pixel 300).

As shown in FIG. 3A, the pixel 300 may include a photodetector 302 (e.g., a photodiode or a phototransistor).

Alternatively, the photodetector 302 may be replaced with a light-emitting element, or with both a photodetector and a light-emitting element.

A metasurface 304 may be disposed over a light-receiving surface 306 of the photodetector 302. The metasurface 304 may include a first conductive layer 308 having an electrically-tunable optical property (e.g., a tunable refractive index), and an array of conductive nanostructures 310 disposed on a first side of the first conductive layer 308. In some cases, the first conductive layer 308 may include indium tin oxide (ITO). The first conductive layer 308 may also or alternatively include boron nitride (BN), silicon (Si), a two-dimensional (2D) material (e.g., hexagonal BN (h-BN), graphene, or molybdenum disulfide ($MoS_2$)), a semiconductor material, and so on. In some cases, the first conductive layer 308 may be doped or treated to change its charge carrier concentration. The array of conductive nanostructures 310 may include an array of nanowires, nanocrosses, nanoprisms, or other nanostructures. The conductive nanostructures 310 may include one or more of gold (Au), silver (Ag), aluminum (Al), or other conductive materials.

The pixel 300 may include a second conductive layer 312 on a second side of the first conductive layer. The second conductive layer 312 may be a continuous layer of conductive material, or the second conductive layer 312 may include an array of conductive structures (e.g., a second array of conductive nanostructures). In some cases, the second conductive layer 312 may include one or more of gold, silver, aluminum, or other conductive materials.

The pixel 300 may further include an electrical insulator 314 disposed between the first conductive layer 308 and the second conductive layer 312. The electrical insulator 314 may be a continuous layer of electrically insulating material, or may include an array of electrically insulating structures. In some cases, the electrical insulator 314 may include alumina ($Al_2O_3$).

Optionally, a silicon nitride ($Si_3N_4$) layer 316 may be positioned between the photodetector 302 and the second conductive layer 312, with the second conductive layer 312 being disposed on the silicon nitride layer 316.

The metasurface 304, electrical insulator 314, and second conductive layer 312 form a metal-insulator-metal junction. Applying an external voltage across the junction may cause free charge carriers to be redistributed in the first conductive layer 308, which may alter both its electrical properties (e.g., carrier concentration) and optical properties (e.g., refractive index). While the array of conductive nanostructures 310 may be engineered to provide a default narrow-band transmission/reflection filtering peak (i.e., an optical passband peak) for the metasurface 304, by means of the chosen geometrical properties for the array of conductive nanostructures 310, the narrow-band transmission/reflection filtering peak may be tuned to different peaks by applying different external voltages to the metasurface 304.

An external voltage may be applied by a voltage source 318 that is electrically connected to the metasurface 304 and the second conductive layer 312 and, in some cases, may be connected to the array of conductive nanostructures 310 and the second conductive layer 312.

A controller 320 may be used to change the electrical bias (e.g., voltage, $V_g$) of the metasurface 304. For example, the controller 320 may be coupled to the voltage source 318 and may change the voltage applied to the metasurface 304 by programming the voltage source 318. More specifically, the controller 320 may program the voltage source 318 to tune or change a voltage between the metasurface 304 and the second conductive layer 312, or between the array of conductive nanostructures 310 and the second conductive layer 312, or between the first conductive layer 308 and the second conductive layer 312.

Changing the electrical bias (e.g., voltage) of the metasurface 304 may tune the state of the electrically-tunable optical property of the first conductive layer 308. In some cases, the controller 320 may cause a first voltage, a second voltage, and so on to be applied to the metasurface 304. At each voltage, the electrically-tunable optical property of the first conductive layer 308 may assume a different state. The different states may result from different carrier concentrations of the first conductive layer 308. In some cases, one of the voltages (or other electrical biases) may be a neutral voltage, ground, or steady-state voltage of the metasurface 304 when the voltage source 318 is disconnected from the metasurface 304 or in an off state (e.g., at zero volts (V)).

The state of the electrically-tunable optical property of the first conductive layer 308 may influence or determine a corresponding state of an electrically-tunable optical filtering property of the metasurface 304. When the electrically-tunable optical filtering property of the metasurface 304 is an optical passband peak, a first state of the electrically-tunable optical filtering property may be associated with a first optical passband peak at a first electromagnetic radiation wavelength. A second state of the electrically-tunable optical filtering property may be associated with a second optical passband peak at a second electromagnetic radiation wavelength. This enables the metasurface 304 to operate as an electrically-tunable optical filter (i.e., an electrically-tunable electromagnetic radiation filter), such as a tunable color filter. In some cases, both the first and second optical passband peaks may be at different visible electromagnetic radiation wavelengths (e.g., green, yellow, red, blue, and so on), or at different non-visible electromagnetic radiation wavelengths (e.g., at one or more IR, near-IR, or UV electromagnetic radiation wavelengths), or at respective visible and non-visible electromagnetic radiation wavelengths.

In some embodiments of the pixel 300, the first conductive layer 308 may be formed of or include ITO; the array of conductive nanostructures 310 may be or include an array of gold nanowires; the second conductive layer 312 may be formed of or include gold; the electrical insulator 314 may be formed of or include alumina; and the second conductive layer 312 may be disposed on a silicon nitride layer 316.

FIG. 3B shows a plan view of an example array of conductive nanostructures 310 included in the pixel 300. In FIG. 3B, each conductive nanostructure 310 is shown to be a nanowire having a width (W) and a length (L). By way of example, each conductive nanostructure 310 is shown to have a square or rectangular block-like shape, with different conductive nanostructures 310 having a periodicity of $P_x$ in an x-direction of a Cartesian coordinate system, and a periodicity of $P_y$ in a y-direction of the Cartesian coordinate system. The separation between conductive nanostructures is $S_x$ in the x-direction ($S_x=P_x-W$) and $S_y$ in the y-direction ($S_y=P_y-L$).

FIG. 3C shows a perspective view of an example conductive nanostructure 310 included in the array of conductive nanostructures 310. As shown, the conductive nanostructure 310 may have a block-like shape, with a width (W), length (L), and height (H).

When constructing the pixel 300, the parameters W, L, H, Px, Py, Sx, and Sy may all be adjusted to set a default optical passband peak for the metasurface 304. The default optical passband peak is an optical passband peak (or state) that exists when the metasurface 304 is biased to a neutral voltage, ground, or steady-state voltage that may exist when the voltage source 318 is disconnected from the metasurface 304 or in an off state (e.g., at zero volts (V)).

Figure 3D:
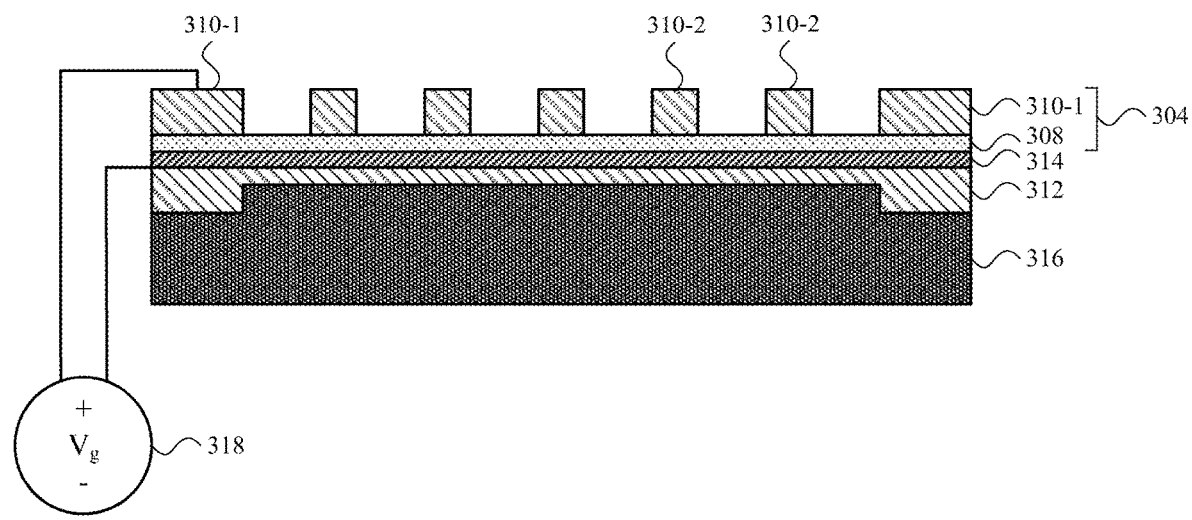
FIG. 3D shows an alternative view of the layers circumscribed by the bubble IIID in FIG. 3A.

FIG. 3D shows an alternative view of the layers circumscribed by the bubble IIID in FIG. 3A. As shown in FIG. 3D, the conductive nanostructures 310 may have different sizes or shapes, depending on where they are located. For example, one or more conductive nanostructures 310-1 near one or more peripheral portions of the pixel 300 may have larger widths or lengths (or even a larger height), and may be designed for connection (bonding) of a wire or conductive trace that connects the array of conductive nanostructures 310 to the voltage source 318. One or more conductive nanostructures 310-2 positioned more interior to the pixel 300 may have smaller widths or lengths (and even smaller heights), and may be designed specifically to tune the optical characteristics of the array of conductive nanostructures 310.

As also shown in FIG. 3D, the second conductive layer 312, and in some cases the first conductive layer 308 and the insulator 314, may be thinned. Thinning these layers can improve their transmissivity, reduce the height of the pixel 300, reduce materials cost, and so on. In some embodiments, peripheral portions of the second conductive layer 312 may be made thicker than an interior portion of the second conductive layer 312, to provide a more substantial conductive pad for connection (bonding) of a wire or conductive trace that connects the second conductive layer 312 to the voltage source 318.

Figure 4:
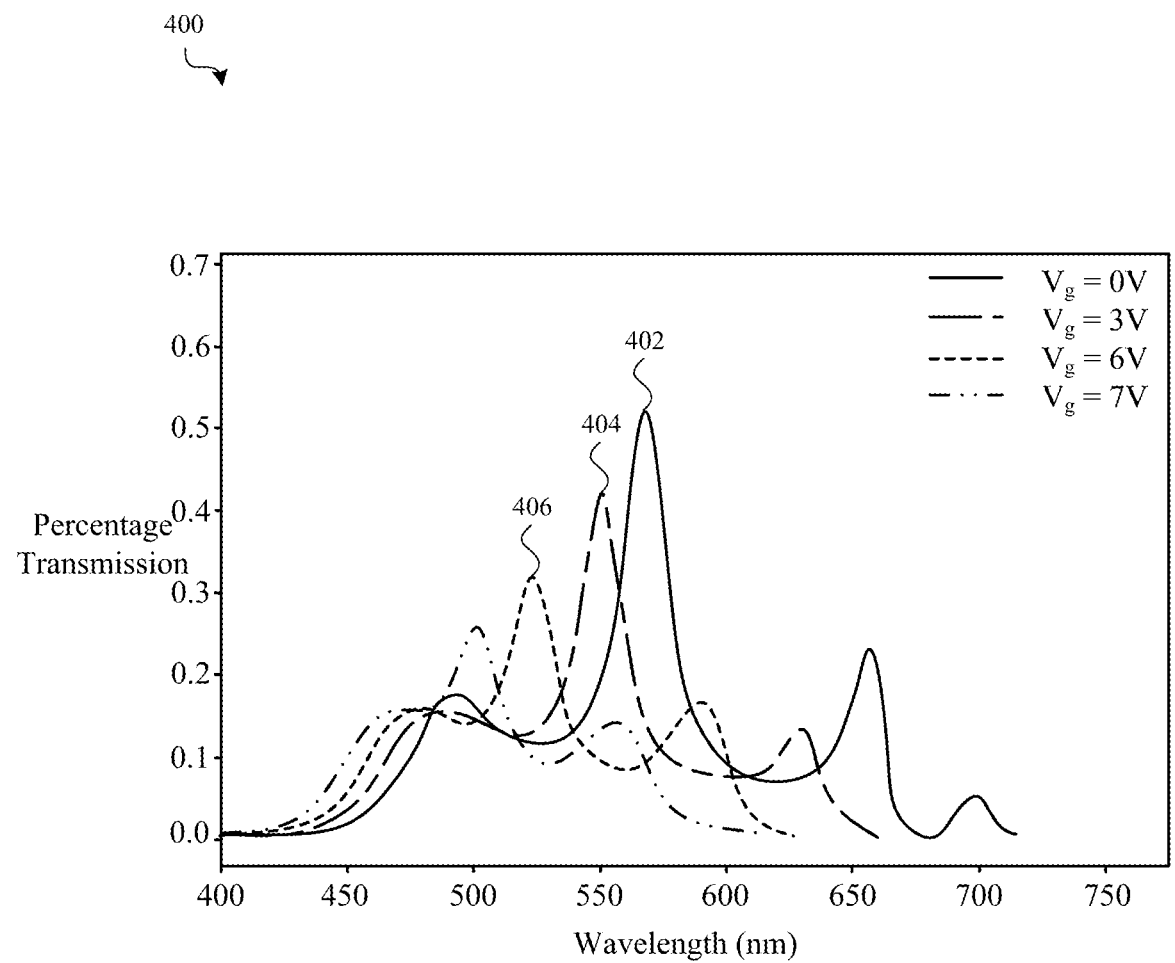
FIG. 4 shows a graph of the different optical responses that may be provided by a metasurface tuned to different representative states.

FIG. 4 shows a graph 400 of the different optical responses that may be provided by a metasurface tuned to different representative states. As an example, the metasurface may be the metasurface described with reference to any of FIGS. 1-3C. The horizontal axis of the graph 400 shows a range of example electromagnetic radiation wavelengths. The vertical axis shows a percentage transmission (e.g., 0.7=70%) of electromagnetic radiation through a metasurface.

The graphed waveforms (402, 404, 406, and so on) show the optical passband and optical passband peak of the metasurface when it is electrically biased to various voltages.

Figure 5A:
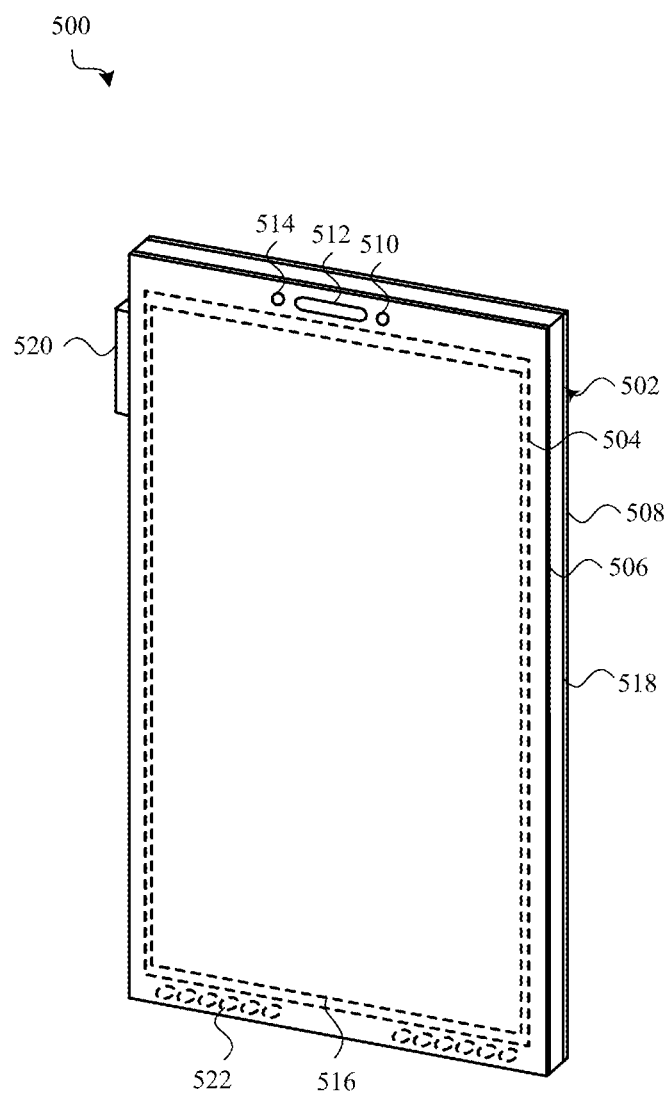
FIGS. 5A and 5B show a first example of an electronic device.
Figure 5B:
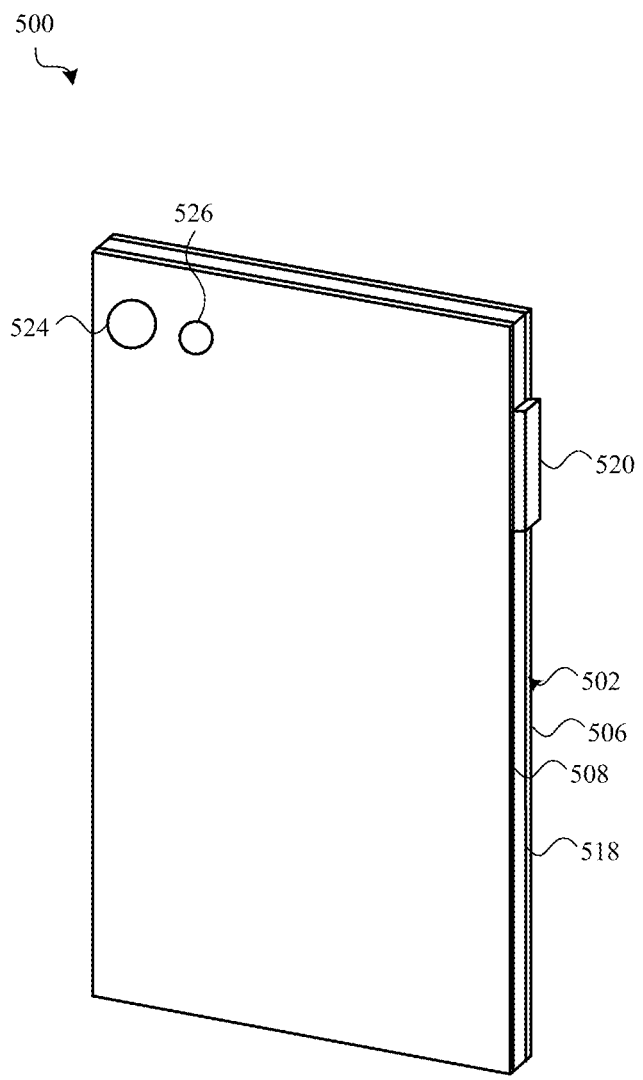

FIGS. 5A and 5B show a first example of an electronic device 500. The device's dimensions and form factor, including the ratio of the length of its long sides to the length of its short sides, suggest that the device 500 is a mobile phone (e.g., a smartphone). However, the device's dimensions and form factor are arbitrarily chosen, and the device 500 could alternatively be any portable electronic device including, for example, a mobile phone, tablet computer, portable computer, portable music player, health monitor device, portable terminal, vehicle navigation system, robot navigation system, wearable device (e.g., a head-mounted display (HMD), glasses, watch, earphone or earbud, and so on), or other portable or mobile device. The device 500 could also be a device that is semi-permanently located (or installed) at a single location. FIG. 5A shows a front isometric view of the device 500, and FIG. 5B shows a rear isometric view of the device 500. The device 500 may include a housing 502 that at least partially surrounds a display 504. The housing 502 may include or support a front cover 506 or a rear cover 508. The front cover 506 may be positioned over the display 504, and may provide a window through which the display 504 may be viewed. In some embodiments, the display 504 may be attached to (or abut) the housing 502 and/or the front cover 506. In alternative embodiments of the device 500, the display 504 may not be included and/or the housing 502 may have an alternative configuration.

The display 504 may include one or more light-emitting elements and may be configured, for example, as an LED display, an organic LED (OLED) display, a liquid crystal display (LCD), an electroluminescent (EL) display, or other type of display. In some embodiments, the display 504 may include, or be associated with, one or more touch and/or force sensors that are configured to detect a touch and/or a force applied to a surface of the front cover 506.

The various components of the housing 502 may be formed from the same or different materials. For example, a sidewall 518 of the housing 502 may be formed using one or more metals (e.g., stainless steel), polymers (e.g., plastics), ceramics, or composites (e.g., carbon fiber). In some cases, the sidewall 518 may be a multi-segment sidewall including a set of antennas. The antennas may form structural components of the sidewall 518. The antennas may be structurally coupled (to one another or to other components) and electrically isolated (from each other or from other components) by one or more non-conductive segments of the sidewall 518. The front cover 506 may be formed, for example, using one or more of glass, a crystal (e.g., sapphire), or a transparent polymer (e.g., plastic) that enables a user to view the display 504 through the front cover 506. In some cases, a portion of the front cover 506 (e.g., a perimeter portion of the front cover 506) may be coated with an opaque ink to obscure components included within the housing 502. The rear cover 508 may be formed using the same material(s) that are used to form the sidewall 518 or the front cover 506. In some cases, the rear cover 508 may be part of a monolithic element that also forms the sidewall 518 (or in cases where the sidewall 518 is a multi-segment sidewall, those portions of the sidewall 518 that are non-conductive). In still other embodiments, all of the exterior components of the housing 502 may be formed from a transparent material, and components within the device 500 may or may not be obscured by an opaque ink or opaque structure within the housing 502.

The front cover 506 may be mounted to the sidewall 518 to cover an opening defined by the sidewall 518 (i.e., an opening into an interior volume in which various electronic components of the device 500, including the display 504, may be positioned). The front cover 506 may be mounted to the sidewall 518 using fasteners, adhesives, seals, gaskets, or other components.

A display stack or device stack (hereafter referred to as a "stack") including the display 504 may be attached (or abutted) to an interior surface of the front cover 506 and extend into the interior volume of the device 500. In some cases, the stack may include a touch sensor (e.g., a grid of capacitive, resistive, strain-based, ultrasonic, or other type of touch sensing elements), or other layers of optical, mechanical, electrical, or other types of components. In some cases, the touch sensor (or part of a touch sensor system) may be configured to detect a touch applied to an outer surface of the front cover 506 (e.g., to a display surface of the device 500).

In some cases, a force sensor (or part of a force sensor system) may be positioned within the interior volume below and/or to the side of the display 504 (and in some cases within the device stack). The force sensor (or force sensor system) may be triggered in response to the touch sensor detecting one or more touches on the front cover 506 (or a location or locations of one or more touches on the front cover 506), and may determine an amount of force associated with each touch, or an amount of force associated with the collection of touches as a whole. Alternatively, the force sensor (or force sensor system) may trigger operation of the touch sensor (or touch sensor system) in response to detecting a force on the front cover 506. In some cases, the force sensor (or force sensor system) may be used to determine the locations of touches on the front cover 506, and may thereby function as a touch sensor (or touch sensor system).

As shown primarily in FIG. 5A, the device 500 may include various other components. For example, the front of the device 500 may include one or more front-facing cameras 510, speakers 512, microphones, or other components 514 (e.g., audio, imaging, sensing components, and/or light sources) that are configured to transmit or receive signals to/from the device 500. In some cases, a front-facing camera 510, alone or in combination with other sensors, may be configured to operate as a bio-authentication or facial recognition sensor. The device 500 may also include various input and/or output devices 516, which may be accessible from the front surface (or display surface) of the device 500. In some cases, the front-facing camera 510, I/O devices 516, and/or other sensors of the device 500 may be integrated with a display stack of the display 504 and moved under the display 504.

In some cases, one or more of the camera 510, components 514, and/or I/O devices 516 may include one or an array of optical sensors or optical sensor pixels, some or all of which may be configured as described in the present disclosure. The optical sensors or optical sensor pixels may be used, for example, as one or more ambient light sensors, proximity sensors, touch sensors, biometric sensors, time-of-flight sensors, depth sensors, optical signal receivers, and so on. In some cases, one or more of the display 504 and/or components 514 may include one or an array of optical emitters or optical emitter pixels, some or all of which may be configured as described in the present disclosure. The optical emitters or optical emitter pixels may be used, for example, as one or more display elements (e.g., display pixels), illuminators, optical signal transmitters, and so on. Each of the optical sensors, optical sensor pixels, optical emitters, and/or optical emitter pixels may be configured to receive or emit different electromagnetic radiation wavelengths at different times, by electrically tuning an optical property of a layer of a metasurface of the respective sensor, emitter, or pixel.

The device 500 may also include buttons or other input devices positioned along the sidewall 518 and/or on a rear surface of the device 500. For example, a volume button or multipurpose button 520 may be positioned along the sidewall 518, and in some cases may extend through an aperture in the sidewall 518. The sidewall 518 may include one or more ports 522 that allow air, but not liquids, to flow into and out of the device 500. In some embodiments, one or more sensors may be positioned in or near the port(s) 522. For example, an ambient light sensor or other optical sensor, ambient pressure sensor, ambient temperature sensor, internal/external differential pressure sensor, gas sensor, particulate matter sensor, or air quality sensor may be positioned in or near a port 522. In some cases, one or more sensors positioned near a port 522 may be an optical sensor as described herein.

In some embodiments, the rear surface of the device 500 may include a rear-facing camera 524 or other optical sensor or optical sensor pixel(s) (see FIG. 5B). A flash or light source 526 (e.g., an optical emitter or optical emitter pixel) may also be positioned along the rear of the device 500 (e.g., near the rear-facing camera). In some cases, the rear surface of the device 500 may include multiple rear-facing cameras.

The camera(s), microphone(s), pressure sensor(s), temperature sensor(s), biometric sensor(s), button(s), proximity sensor(s), touch sensor(s), force sensor(s), particulate matter or air quality sensor(s), optical sensor(s), and so on of the device 500 may form parts of various sensor systems.

Figure 6A:
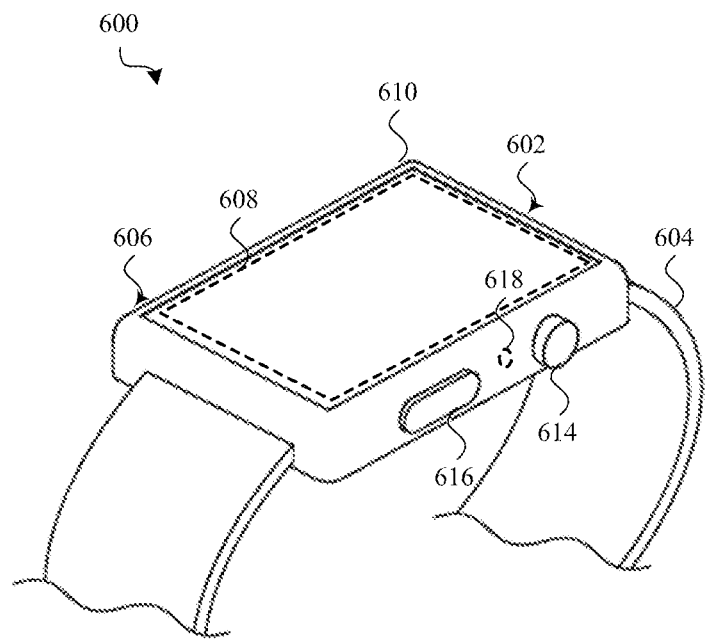
FIGS. 6A and 6B show a second example of an electronic device.
Figure 6B:
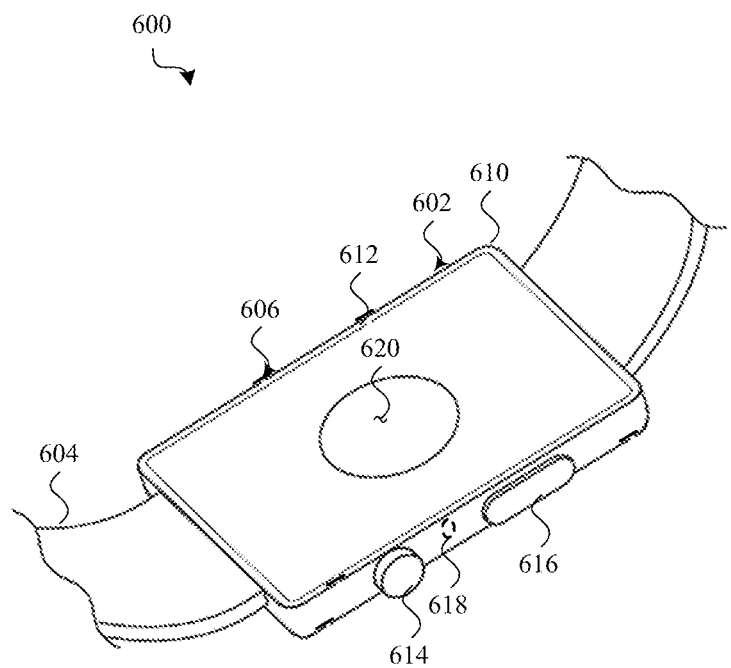

FIGS. 6A and 6B show a second example of an electronic device 600. The device's dimensions and form factor, and inclusion of a band 604, suggest that the device 600 is an electronic watch. However, the device 600 could alternatively be any wearable electronic device. FIG. 6A shows a front isometric view of the device 600, and FIG. 6B shows a rear isometric view of the device 600. The device 600 may include a body 602 (e.g., a watch body) and a band 604. The watch body 602 may include an input or selection device, such as a crown 614 or a button 616. The band 604 may be used to attach the body 602 to a body part (e.g., an arm, wrist, leg, ankle, or waist) of a user. The body 602 may include a housing 606 that at least partially surrounds a display 608. The housing 606 may include or support a front cover 610 (FIG. 6A) or a rear cover 612 (FIG. 6B). The front cover 610 may be positioned over the display 608, and may provide a window through which the display 608 may be viewed. In some embodiments, the display 608 may be attached to (or abut) the housing 606 and/or the front cover 610. In alternative embodiments of the device 600, the display 608 may not be included and/or the housing 606 may have an alternative configuration.

The housing 606 may in some cases be similar to the housing described with reference to FIGS. 5A and 5B, and the display 608 may in some cases be similar to the display described with reference to FIGS. 5A-5B.

The device 600 may include various sensor systems, and in some embodiments may include some or all of the sensor systems included in the device described with reference to FIGS. 5A-5B. In some embodiments, the device 600 may have a port 618 (or set of ports) on a side of the housing 606 (or elsewhere), and an ambient light sensor or other optical sensor, ambient pressure sensor, ambient temperature sensor, internal/external differential pressure sensor, gas sensor, particulate matter sensor, or air quality sensor may be positioned in or near the port(s) 618. In some cases, one or more sensors positioned near a port 618 may be an optical sensor as described herein.

In some cases, the rear surface (or skin-facing surface) of the device 600 may include a flat or raised area 620 that includes one or more skin-facing sensors. For example, the area 620 may include a heart-rate monitor, a respiration-rate monitor, or a blood pressure monitor. The area 620 may also include an off-wrist detector or other sensor. In some cases, one or more of the skin-facing sensors may be an optical sensor as described herein.

In some cases, one or more cameras, sensors, light sources, or I/O devices of the device 600 (including optical sensors in its body 602, band 604, or band attachment mechanism) may include one or more optical sensors, optical sensor pixels, optical emitters, or optical emitter pixels, some or all of which may be configured as described in the present disclosure. The optical sensors or optical sensor pixels may be used, for example, as one or more ambient light sensors, proximity sensors, touch sensors, biometric sensors, time-of-flight sensors, depth sensors, optical signal receivers, and so on. The optical emitters or optical emitter pixels may be used, for example, as one or more display elements (e.g., display pixels), illuminators, optical signal transmitters, and so on. Each of the optical sensors, optical sensor pixels, optical emitters, and/or optical emitter pixels may be configured to receive or emit different electromagnetic radiation wavelengths at different times, by electrically tuning an optical property of a layer of a metasurface of the respective sensor, emitter, or pixel.

Figure 7:
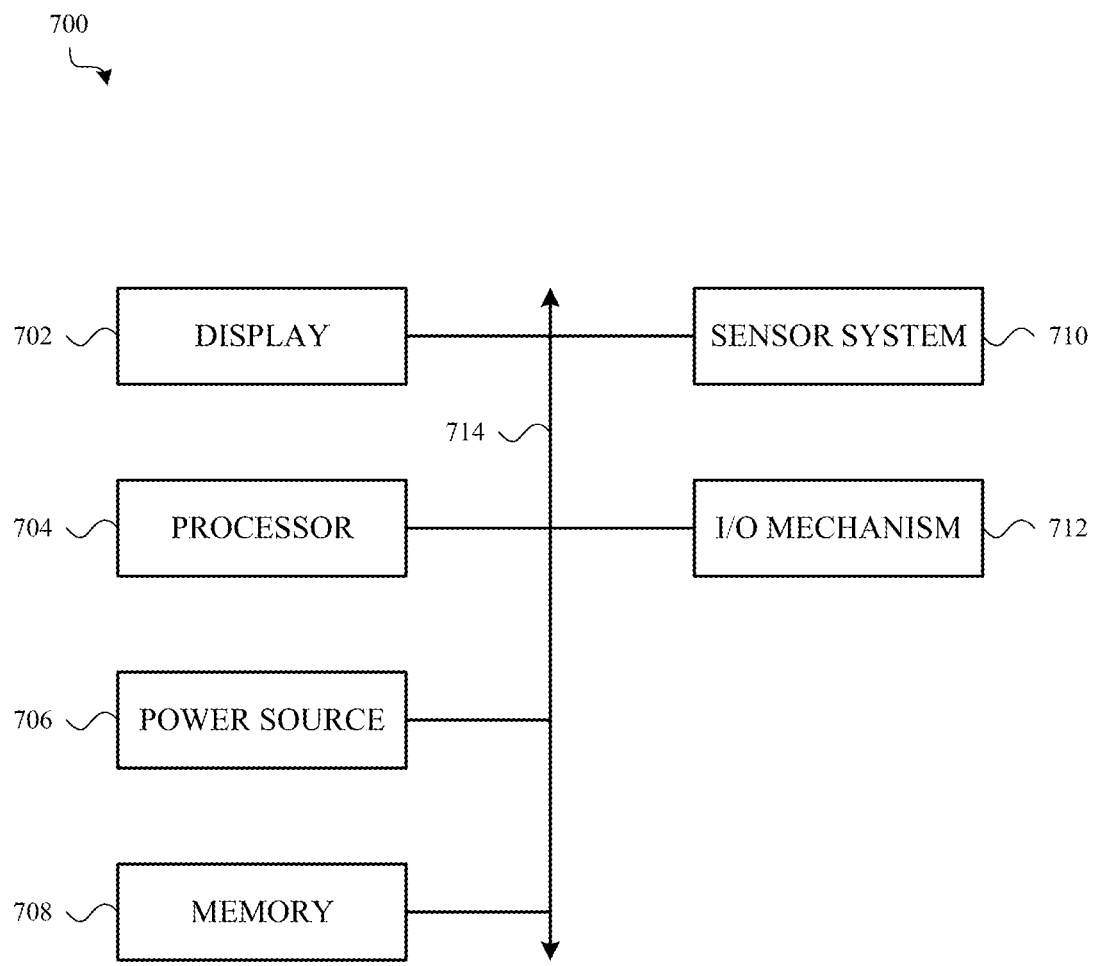
FIG. 7 shows an example block diagram of an electronic device.

FIG. 7 shows a sample electrical block diagram of an electronic device 700, which electronic device may in some cases take the form of the device described with reference to FIGS. 5A-5B or FIGS. 6A-6B and/or include the optical sensor, optical emitter, pixel, or array of pixels described with reference to any of FIGS. 1-3C and 5A-6B. The electronic device 700 may include a display 702 (e.g., a light-emitting display), a processor 704, a power source 706, a memory 708 or storage device, a sensor system 710, or an input/output (I/O) mechanism 712 (e.g., an input/output device, input/output port, or haptic input/output interface). The processor 704 may control some or all of the operations of the electronic device 700. The processor 704 may communicate, either directly or indirectly, with some or all of the other components of the electronic device 700. For example, a system bus or other communication mechanism 714 can provide communication between the display 702, the processor 704, the power source 706, the memory 708, the sensor system 710, and the I/O mechanism 712.

The processor 704 may be implemented as any electronic device capable of processing, receiving, or transmitting data or instructions, whether such data or instructions is in the form of software or firmware or otherwise encoded. For example, the processor 704 may include a microprocessor, a central processing unit (CPU), an application-specific integrated circuit (ASIC), a digital signal processor (DSP), a controller, or a combination of such devices. As described herein, the term "processor" is meant to encompass a single processor or processing unit, multiple processors, multiple processing units, or other suitably configured computing element or elements.

It should be noted that the components of the electronic device 700 can be controlled by multiple processors. For example, select components of the electronic device 700 (e.g., the sensor system 710) may be controlled by a first processor and other components of the electronic device 700 (e.g., the display 702) may be controlled by a second processor, where the first and second processors may or may not be in communication with each other.

The power source 706 can be implemented with any device capable of providing energy to the electronic device 700. For example, the power source 706 may include one or more batteries or rechargeable batteries. Additionally or alternatively, the power source 706 may include a power connector or power cord that connects the electronic device 700 to another power source, such as a wall outlet.

The memory 708 may store electronic data that can be used by the electronic device 700. For example, the memory 708 may store electrical data or content such as, for example, audio and video files, documents and applications, device settings and user preferences, timing signals, control signals, and data structures or databases. The memory 708 may include any type of memory. By way of example only, the memory 708 may include random access memory, read-only memory, Flash memory, removable memory, other types of storage elements, or combinations of such memory types.

The electronic device 700 may also include one or more sensor systems 710 positioned almost anywhere on the electronic device 700. In some cases, sensor systems 710 may be positioned as described with reference to FIGS. 5A-5B or FIGS. 6A-6B. The sensor system(s) 710 may be configured to sense one or more type of parameters, such as, but not limited to, electromagnetic radiation (light); touch; force; heat; movement; relative motion; biometric data (e.g., biological parameters) of a user; particulate matter concentration, air quality; proximity; position; connectedness; and so on. By way of example, the sensor system(s) 710 may include a heat sensor, a position sensor, a light or optical sensor (e.g., an ambient light sensor or proximity sensor), an accelerometer, a pressure transducer, a gyroscope, a magnetometer, a health monitoring sensor, a particulate matter sensor, an air quality sensor, and so on. Additionally, the one or more sensor systems 710 may utilize any suitable sensing technology, including, but not limited to, magnetic, capacitive, ultrasonic, resistive, optical, acoustic, piezoelectric, or thermal technologies.

The I/O mechanism 712 may transmit or receive data from a user or another electronic device. The I/O mechanism 712 may include the display 702, a touch sensing input surface, a crown, one or more buttons (e.g., a graphical user interface "home" button), one or more cameras (including an under-display camera), one or more microphones or speakers, one or more ports such as a microphone port, and/or a keyboard. Additionally or alternatively, the I/O mechanism 712 may transmit electronic signals via a communications interface, such as a wireless, wired, and/or optical communications interface. Examples of wireless and wired communications interfaces include, but are not limited to, cellular and Wi-Fi communications interfaces.

Figure 8:
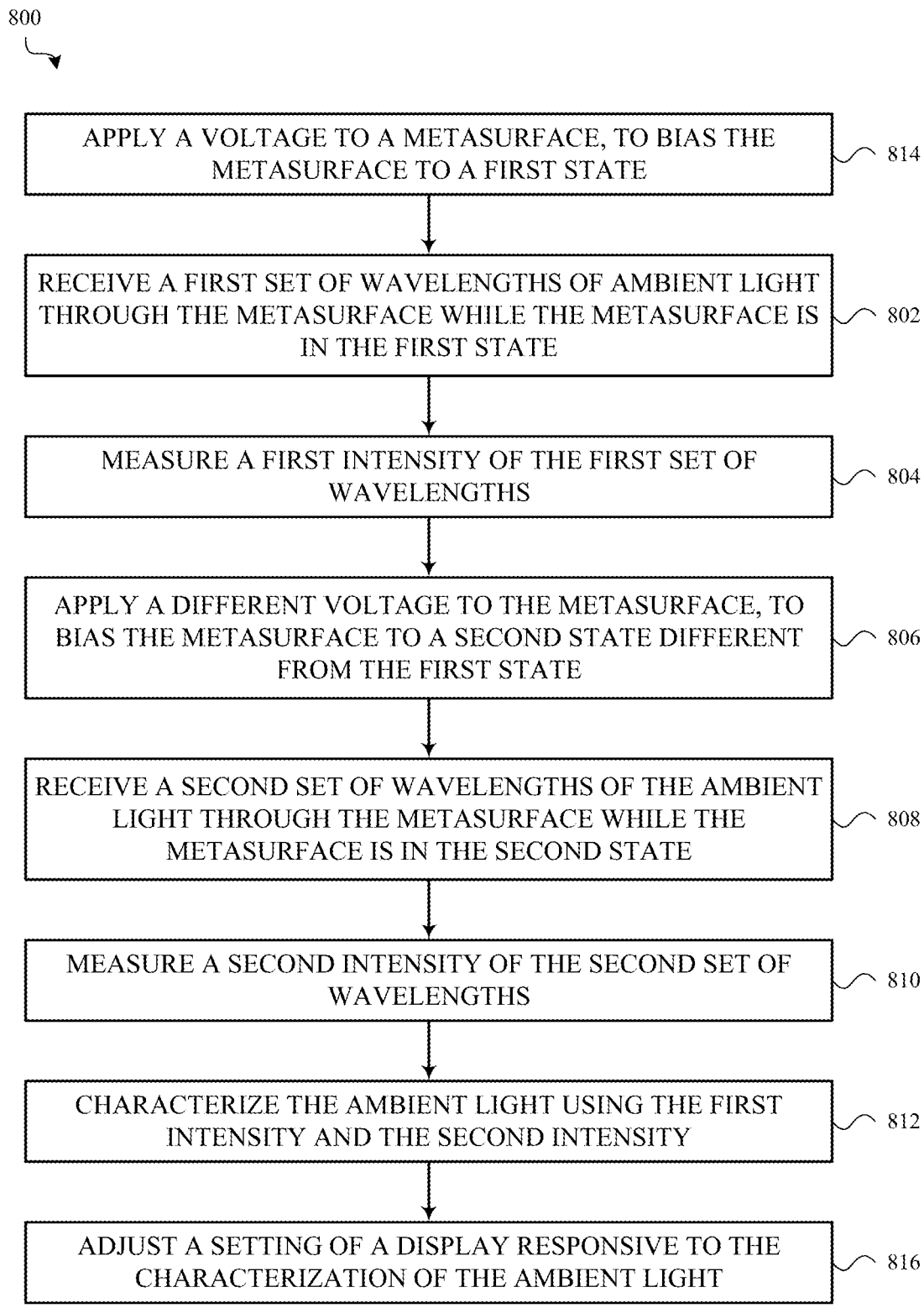
FIG. 8 shows an example method of characterizing ambient light.

FIG. 8 shows an example method 800 of characterizing ambient light. The method 800 may be performed, for example, using the optical sensor described with reference to FIG. 1, 2, 3A-3D, 5A-5B, 6A-6B, or 7.

At block 802, the method 800 may include receiving a first set of wavelengths of the ambient light through a metasurface, while the metasurface is in a first state. The metasurface may include an array of nanowires formed on a layer of material having an electrically-tunable optical property (e.g., a tunable refractive index). In various embodiments, the metasurface may be configured similarly to any of the metasurfaces described herein.

At block 804, the method 800 may include measuring a first intensity of the first set of wavelengths.

At block 806, the method 800 may include applying a voltage (e.g., a first voltage) to the metasurface, to bias the metasurface to a second state different from the first state.

At block 808, the method 800 may include receiving a second set of wavelengths of the ambient light through the metasurface, while the metasurface is in the second state.

At block 810, the method 800 may include measuring a second intensity of the second set of wavelengths.

At block 812, the method 800 may include characterizing the ambient light using the first intensity and the second intensity.

Optionally, and at block 814, the method 800 may include applying a second voltage to the metasurface, to bias the metasurface to the first state prior to measuring the first intensity of the first set of wavelengths at block 804.

Optionally, and at block 816, the method 800 may include adjusting a setting of a display responsive to the characterization of the ambient light.

Optionally, the method 800 may include applying at least one additional voltage to the metasurface to bias the metasurface to at least one respective additional state. In some cases, a respective additional set of wavelengths of ambient light may be received through the metasurface while the metasurface is biased to each of the at least one additional state, and the intensity of each additional set of wavelengths may be measured. The ambient light may then be characterized using the measured intensities of any of the sets of wavelengths.

The foregoing description, for purposes of explanation, uses specific nomenclature to provide a thorough understanding of the described embodiments. However, it will be apparent to one skilled in the art, after reading this description, that the specific details are not required in order to practice the described embodiments. Thus, the foregoing descriptions of the specific embodiments described herein are presented for purposes of illustration and description. They are not targeted to be exhaustive or to limit the embodiments to the precise forms disclosed. It will be apparent to one of ordinary skill in the art, after reading this description, that many modifications and variations are possible in view of the above teachings.

What is claimed is:

1. An optoelectronic device, comprising:
   a pixel having a light-emitting surface and including,
      a metasurface disposed over the light-emitting surface and including an array of conductive nanostructures disposed on a first conductive layer;
      a second conductive layer disposed over the light-emitting surface; and
      an insulating layer disposed over the light-emitting surface, between the metasurface and the second conductive layer;
   a voltage source electrically connected to the metasurface and the second conductive layer; and
   a controller configured to change a voltage between the metasurface and the second conductive layer.

2. The optoelectronic device of claim 1, further comprising:
   an array of pixels including the pixel, wherein multiple pixels in the array of pixels each include,
      a respective metasurface including a respective array of conductive nanostructures disposed on a respective first conductive layer;
      a respective second conductive layer; and
      a respective insulating layer disposed between the respective metasurface and the respective second conductive layer; and
   a respective voltage source electrically connected to the respective metasurface and the respective second conductive layer of each pixel in the multiple pixels.

3. The optoelectronic device of claim 2, wherein:
   the pixel is a first pixel;
   the multiple pixels include a second pixel; and
   the controller is configured to program respective voltage sources that are electrically connected to the first pixel and the second pixel, to apply a same voltage to the first pixel and to the second pixel at a same time.

4. The optoelectronic device of claim 2, wherein:
   the pixel is a first pixel;
   the multiple pixels include a second pixel;
   the controller is configured to program respective voltage sources that are electrically connected to the first pixel and the second pixel, to apply a first voltage to the first pixel and a second voltage to the second pixel at a same time; and
   the first voltage is different from the second voltage.

5. The optoelectronic device of claim 2, wherein each pixel of the multiple pixels comprises a respective photodetector positioned to receive electromagnetic radiation through a respective metasurface.

6. The optoelectronic device of claim 2, wherein each pixel of the multiple pixels comprises a respective optical emitter positioned to emit electromagnetic radiation through a respective metasurface.

7. A method of measuring light, comprising:
   receiving a first set of wavelengths of light through a metasurface while the metasurface is in a first state, the metasurface comprising an array of nanostructures and a layer of material having an electrically-tunable optical property;
   measuring a first intensity of the first set of wavelengths;
   applying a voltage to the metasurface to bias the metasurface to a second state different from the first state;
   receiving a second set of wavelengths of light through the metasurface while the metasurface is in the second state; and
   measuring a second intensity of the second set of wavelengths.

8. The method of claim 7, wherein:
   the light including the first set of wavelengths and the second set of wavelengths is ambient light; and
   the method further comprises characterizing the ambient light using at least the first intensity and the second intensity.

9. The method of claim 7, wherein the layer of material having the electrically tunable optical property comprises indium tin oxide.

10. The method of claim 7, further comprising:
    applying at least one additional voltage to the metasurface to bias the metasurface to at least one respective additional state.

11. The method of claim 7, further comprising:
    adjusting a setting of a display responsive to the characterization of the ambient light.

12. An optical device stack, comprising:
    at least one of a photodetector or an optical emitter;
    a metasurface disposed over at least one of a light-receiving surface of the photodetector or a light emission surface of the optical emitter and including,
       a first conductive layer having an electrically-tunable optical property; and
       an array of conductive nanostructures disposed on a first side of the first conductive layer;
    a second conductive layer disposed on a second side of the first conductive layer, over at least one of the light-receiving surface of the photodetector or the light emission surface of the optical emitter; and
    an electrical insulator disposed between the first conductive layer and the second conductive layer.

13. The optical device stack of claim 12, wherein a change in an electrical bias between the metasurface and the second conductive layer, from a first electrical bias to a second electrical bias, tunes the electrically-tunable optical property from a first state to a second state and changes an electrically-tunable optical filtering property of the metasurface.

14. The optical device stack of claim 12, wherein the first conductive layer comprises indium tin oxide.

15. The optical device stack of claim 12, wherein the array of conductive nanostructures comprises an array of nanowires.

16. The optical device stack of claim 12, wherein the second conductive layer comprises gold.

17. The optical device stack of claim 12, further comprising:
    a silicon nitride layer; wherein,
    the second conductive layer is disposed on the silicon nitride layer and is between the silicon nitride layer and the electrical insulator.

18. The optical device stack of claim 12, wherein:
the first electrical bias is zero volts (V); and
when the electrically-tunable optical property is tuned to the first state, the metasurface has an optical passband peak at a visible electromagnetic radiation wavelength.

19. The optical device stack of claim 18, wherein the visible electromagnetic radiation wavelength is one of a red electromagnetic radiation wavelength, a green electromagnetic radiation wavelength, or a blue electromagnetic radiation wavelength.

20. The optical device stack of claim 18, wherein:
when the electrically-tunable optical property is tuned to the second state, the metasurface has an optical passband peak at one of,
   a different visible electromagnetic radiation wavelength than when the electrically-tunable optical property is tuned to the first state; or
   a near-infrared electromagnetic radiation wavelength.

* * * * *